United States Patent
Kondo

(10) Patent No.: US 12,491,666 B2
(45) Date of Patent: Dec. 9, 2025

(54) FORMING APPARATUS, FORMING METHOD, AND ARTICLE MANUFACTURING METHOD

(71) Applicant: CANON KABUSHIKI KAISHA, Tokyo (JP)

(72) Inventor: Yousuke Kondo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 99 days.

(21) Appl. No.: 18/324,737

(22) Filed: May 26, 2023

(65) Prior Publication Data
US 2023/0382019 A1    Nov. 30, 2023

(30) Foreign Application Priority Data
May 30, 2022    (JP) .................................. 2022-087574

(51) Int. Cl.
B29C 35/02    (2006.01)
B29C 35/08    (2006.01)

(52) U.S. Cl.
CPC ...... *B29C 35/0288* (2013.01); *B29C 35/0266* (2013.01); *B29C 35/0805* (2013.01); *B29C 2035/0827* (2013.01)

(58) Field of Classification Search
CPC ............ B29C 35/0288; B29C 35/0266; B29C 35/0805; B29C 2035/0827; G03F 7/0002; G03F 7/002; H01L 21/67115; H01L 21/31051; H01L 21/67092; H01L 21/6715
See application file for complete search history.

(56) References Cited

U.S. PATENT DOCUMENTS

| 2010/0124601 A1* | 5/2010 | Ota | B82Y 10/00 427/256 |
| 2012/0200006 A1* | 8/2012 | Minoda | G03F 7/0002 264/293 |
| 2016/0236381 A1* | 8/2016 | Takemura | B29C 43/58 |
| 2016/0299444 A1* | 10/2016 | Komaki | G03F 9/7042 |
| 2018/0253001 A1* | 9/2018 | Sakata | G03F 7/0002 |
| 2020/0333704 A1* | 10/2020 | Koide | G03F 7/0002 |

FOREIGN PATENT DOCUMENTS

| JP | 2011529626 A | 12/2011 |
| JP | 2012164809 A | 8/2012 |
| KR | 20160100232 A | 8/2016 |
| KR | 20160120676 A | 10/2016 |
| TW | 201633375 A | 9/2016 |
| TW | 201642315 A | 12/2016 |

* cited by examiner

*Primary Examiner* — Xiao S Zhao
*Assistant Examiner* — Inja Song
(74) *Attorney, Agent, or Firm* — Canon U.S.A., Inc. IP Division

(57) ABSTRACT

In a case where it is determined that forming processing can be performed, a curable composition on a substrate is cured by a first curing unit in a state where a member is in contact with the curable composition, the member is separated, and the curable composition is further cured by a second curing unit. In a case where it is determined that the forming processing cannot be performed, the curable composition is cured by the second curing unit in a state where the curable composition is separated from the member without the curable composition being cured by the first curing unit. This can prevent carry-out of the substrate to which an uncured composition is applied and contamination inside and outside an apparatus even in a case where normal processing cannot be performed.

9 Claims, 8 Drawing Sheets

FORMING APPARATUS, FORMING METHOD, AND ARTICLE MANUFACTURING METHOD

BACKGROUND OF THE INVENTION

Field of the Invention

The present disclosure relates to a forming apparatus, a forming method, and an article manufacturing method.

Description of the Related Art

With increased demand for miniaturization of a semiconductor device, a microfabrication technique of shaping an uncured composition on a substrate with a mold, curing the composition, and forming a pattern of the composition on the substrate, in addition to a conventional photolithography technique, has been attracting attention. Such a technique is called an imprint technique, and enables forming of a fine pattern in the order of several nanometers on the substrate.

As one example of the imprint technique, there is a photo-curing method. An imprint apparatus that adopts the photo-curing method forms a pattern on the substrate by shaping a photo-curable composition supplied to a shot area on the substrate with a mold, irradiating the composition with light to cure the composition, and separating the cured composition from the mold.

In recent years, a technique of planarizing the composition on the substrate has been proposed (Japanese Unexamined Patent Application Publication No. 2011-529626). The technique discussed in Japanese Unexamined Patent Application Publication No. 2011-529626 attempts to increase accuracy in planarization by allowing droplets of a composition to drip based on a difference in level of the substrate, and curing the composition in a state where a flat surface of the mold is brought into contact with the composition that has dripped.

In forming processing such as imprint processing and planarization processing as just described, in a case where normal processing is performed, the composition on the substrate is carried out from an apparatus in a cured state. In such a case where the forming processing cannot be continued normally, however, there is a possibility that the composition is carried out in an uncured state. Carry-out of the substrate to which the uncured composition is applied is not preferable, because an apparatus that conveys the substrate, an external apparatus that stores the substrate, or the like is contaminated by a chemical vaporized from the uncured composition.

SUMMARY OF THE INVENTION

The present disclosure provides a method of preventing carry-out of a substrate to which a composition in an uncured state is applied and contamination inside and outside an apparatus in a case where normal forming processing cannot be performed.

According to an aspect of the present disclosure, a forming apparatus configured to cure a curable composition on a substrate in a state where a member is in contact with the curable composition to form a layer on the substrate includes an application unit configured to apply the curable composition to the substrate, a first curing unit configured to cure the curable composition on the substrate, a second curing unit configured to cure the curable composition on the substrate, and a control unit configured to perform forming processing of forming the layer by controlling the first curing unit to cure the curable composition applied to the substrate by the application unit in a state where the member is in contact with the curable composition, and then controlling the second curing unit to further cure the curable composition separated from the member, wherein the control unit is configured to, when determining not to perform curing of the curable composition on the substrate by the first curing unit, control the second curing unit to cure the curable composition in a state where the member is separated.

Further features of the present disclosure will become apparent from the following description of exemplary embodiments with reference to the attached drawings.

DESCRIPTION OF THE EMBODIMENTS

A desirable exemplary embodiment of the present disclosure will be described below with reference to the accompanying drawings. In each drawing, identical members are denoted by the same reference number, and a redundant description thereof is omitted.

Figure 1:
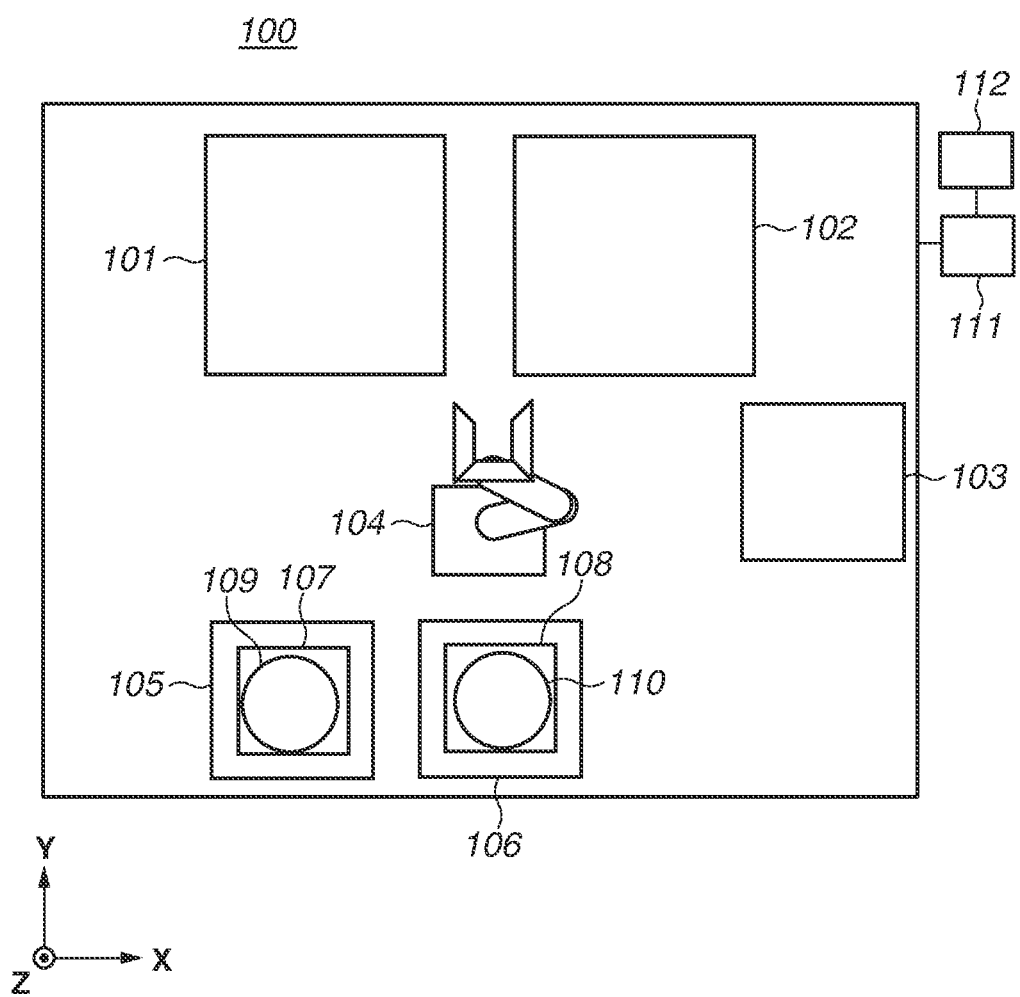
FIG. 1 is a schematic view illustrating a configuration of a planarization apparatus.

FIG. 1 is a schematic view illustrating a configuration of a planarization apparatus 100 (planarization system) used as a forming apparatus. In the present specification and the drawings, directions are indicated in an X-Y-Z coordinate system with a horizontal plane serving as an X-Y plane. Directions that are parallel to an X-axis, a Y-axis, and a Z-axis in the X-Y-Z coordinate system are hereinafter referred to as an X-direction, a Y-direction, and a Z-direction, respectively.

The planarization apparatus 100 includes an application module 101 (an application unit) that applies a curable composition, a planarization module 102 that performs planarization by use of a planarization member 109 (super straight), and a heat processing module 103 that performs heat processing. Furthermore, a conveyance mechanism 104, a planarization member carry-in/carry-out mechanism 105, a substrate carry-in/carry-out mechanism 106, a control unit 111, and an input unit 112 are arranged.

The planarization apparatus 100 according to the present disclosure cures the curable composition on the substrate in a state where the curable composition and the planarization member 109 are in contact with each other, separates the cured composition and the planarization member 109 from each other, and can thereby comprehensively or locally form a flat surface of the cured composition on the substrate. Furthermore, the planarization apparatus 100 additionally cures the separated, cured composition, and can thereby bring the composition into a cured state that is appropriate for post-processing.

In the present exemplary embodiment, a description is provided by use of an example in which one application module 101, one planarization module 102, and one heat processing module 103 are arranged in the planarization apparatus 100. Note that a plurality of application modules 101, a plurality of planarization modules 102, and a plurality of heat processing modules 103 may be arranged.

A silicon wafer is a representative base material of a substrate 110, but the base material of the substrate 110 is not limited thereto. The base material of the substrate 110 can be freely selected from among materials known as base materials for a semiconductor device, such as aluminum, a titanium-tungsten alloy, an aluminum-silicon alloy, an aluminum-copper-silicon alloy, silicon oxide, silicon nitride, or the like. The substrate 110 to be used may be a substrate in which an adhesion layer is formed by surface treatment such as silane coupling treatment, silazane treatment, and film formation of an organic thin film and adhesiveness with respect to the curable composition is increased. The substrate 110 typically has a circular outer peripheral shape with a diameter of 300 mm or 200 mm, but is not limited thereto. For example, the substrate 110 may have an outer peripheral shape with a diameter of 300 mm or more and less than 500 mm.

As the planarization member 109, a mold made of a light-transmissive material may be used in consideration of a light irradiation process. As a material forming the planarization member 109, a light-transmissive resin such as glass, quartz, polymethylmethacrylate (PMMA), and a polycarbonate resin, a transparent metal-deposited film, a flexible film such as polydimethylsiloxane, a photo-curable film, a metal film, or the like is desirable. The planarization member 109 preferably has a circular shape in a size larger than that of the substrate 110.

A thickness of the planarization member 109 is preferably 0.25 mm or more and less than 2 mm, but is not limited thereto.

A substrate carrier 108 that holds a plurality of substrates 110 can be arranged in the substrate carry-in/carry-out mechanism 106. The substrate carry-in/carry-out mechanism 106 is a mechanism used for carrying the substrate 110 from the outside into the planarization apparatus 100 and carrying the substrate 110 out from the planarization apparatus 100 to the outside. A member carrier 107 that holds a plurality of planarization members 109 can be arranged in the planarization member carry-in/carry-out mechanism 105. The planarization member carry-in/carry-out mechanism 105 is a mechanism used for carrying the planarization member 109 from the outside into the planarization apparatus 100 and carrying the planarization member 109 out from the planarization apparatus 100 to the outside.

The conveyance mechanism 104 is a mechanism capable of conveying the planarization member 109 and the substrate 110 in the planarization apparatus 100. Specifically, the conveyance mechanism 104 is capable of performing carry-in and carry-out of the planarization member 109 between the planarization module 102 and a freely-selected slot of the member carrier 107 mounted to the planarization member carry-in/carry-out mechanism 105. The conveyance mechanism 104 is capable of performing carry-in and carry-out of the substrate 110 among the application module 101, the planarization module 102, the heat processing module 103, a cooling chuck 403, and a freely selected slot of the substrate carrier 108 arranged in the substrate carry-in/carry-out mechanism 106. The conveyance mechanism 104 includes a hand that holds the substrate 110 to be carried into each module and a hand that collects the substrate 110 from each module, and is capable of holding two substrates 110 at the same time.

The control unit 111 includes a processor such as a central processing unit (CPU), a storage unit such as a random-access memory (RAM), a read-only memory (ROM), and a hard disk drive (HDD), and an interface unit for connecting an external device and the processor, and controls the whole of the planarization apparatus 100. In other words, the control unit 111 functions as a processing unit that performs centralized control of each module of the planarization apparatus 100 to perform planarization processing. The interface unit includes a communication interface that performs communication with a host computer. The host computer can be, for example, a computer that controls the whole or one area of a factory in which the planarization apparatus 100 is arranged. The processor executes a program stored in a storage unit and controls an operation of the planarization apparatus 100. The control unit 111 may be composed of a plurality of circuit boards, which may be arranged separately inside and outside the planarization apparatus 100.

Figure 2:
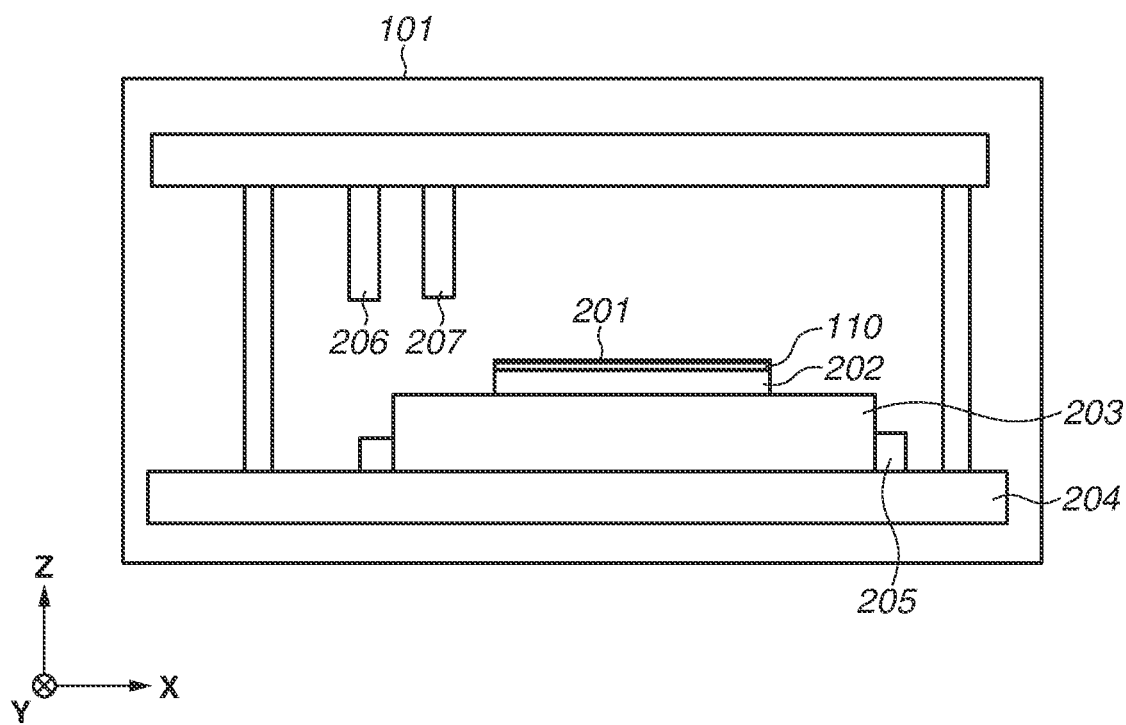
FIG. 2 is a diagram illustrating a configuration of an application module of the planarization apparatus.

FIG. 2 is a configuration diagram illustrating the application module 101 of the planarization apparatus 100. The application module 101 is a module that applies (supplies) a curable material for planarizing the substrate onto the substrate 110 having an uneven surface condition due to processing in a front-end process or the like. Specifically, the application module 101 includes a dispenser 206 including an ejection orifice (nozzle) through which an uncured (liquid) curable composition is ejected onto the substrate 110. The application module 101 places (supplies) droplets of the composition dripped by use of the dispenser 206 on the substrate 110 that is carried in by the conveyance mechanism 104 and held by a substrate chuck 202.

The dispenser 206 employs, for example, a piezo-jet method, a micro solenoid method, or the like, and the dispenser 206 is capable of supplying droplets of the composition in a minute volume onto the substrate 110. The number of ejection orifices in the dispenser 206 is not specifically limited, and may be one (single nozzle) or exceed 100. More specifically, a nozzle array of the dispenser 206 may be a linear nozzle array, or may be a combination of a plurality of linear nozzle arrays.

A substrate stage 203 is capable of moving the substrate 110 over a base 204 in a state where the substrate 110 is held by the substrate chuck 202. As a drive unit 205 that drives the substrate stage 203, a linear motor is used in the present exemplary embodiment. However, the drive unit 205 is not limited thereto, and a known technique such as a drive mechanism in which a ball screw and a rotary motor are combined can be applied. In the present exemplary embodiment, moving directions of the substrate stage 203 are two axial directions of X- and Y-directions, but the moving directions are not limited thereto and may be six axial directions. The application module 101 applies a curable composition 201 by use of the dispenser 206 while scanning the substrate stage 203 on the X-Y plane, and is thereby capable of placing droplets of the curable composition in a desired pattern.

As the curable composition 201 used as a forming material, an ultraviolet curable composition or a thermosetting composition (for example, a resin) is used. The curable composition 201 may include any of a polymerizable compound, a photopolymerization initiator, a non-polymerizable compound, and a solvent. The curable composition 201 may include, as the non-polymerizable compound, at least one of a sensitizer, a hydrogen-donating agent, an internal-additive release agent, a surface-active agent, an antioxidant, or a polymer component. The description is provided of the curable composition 201 according to the present exemplary embodiment by use of an example of a composition cured by irradiation with light (ultraviolet rays) having, for example, a wavelength of 200 to 380 nm. Such a curable composition is cured by being irradiated with light such as ultraviolet rays, and additionally cured by heating after the curing, whereby photosensitive reaction can be completed (post-exposure baking processing).

An off-axis scope 207 is capable of detecting a reference mark arranged on the substrate stage 203, and a mark formed on the substrate 110 mounted on the substrate stage 203. Relative positions of the reference mark on the substrate stage 203 and the substrate 110 are measured by use of the off-axis scope 207. The position of the planarization member 109 or the substrate 110 is adjusted by use of the measured relative positions, whereby application is performed with the dispenser 206 and the substrate 110 being at desired relative positions. The off-axis scope 207 can include a light source, an image pickup element, and an optical system that guides light for detection to a target or the image pickup element.

Figure 3:
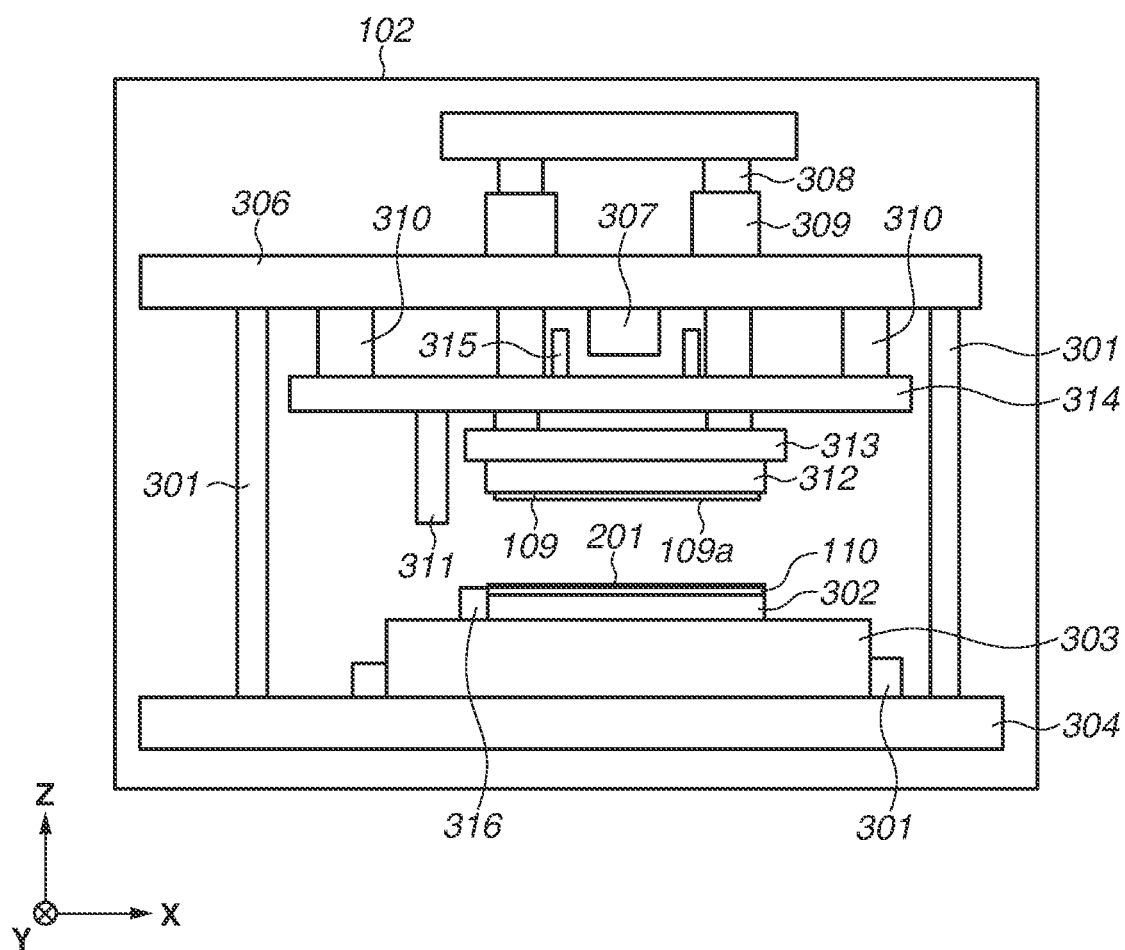
FIG. 3 is a diagram illustrating a configuration of a planarization module of the planarization apparatus.

FIG. 3 is a configuration diagram illustrating the planarization module 102 of the planarization apparatus 100. The planarization module 102 is a module for layer forming processing in which the planarization member 109 is brought into contact with the substrate 110 on which a plurality of droplets of the curable composition has been placed by the application module 101 to planarize the substrate 110, the curable composition is cured, and a planarization layer is formed.

The planarization module 102 includes an irradiation unit 307 that irradiates the curable composition 201 supplied onto the substrate 110 with light to cure the curable composition 201. The irradiation unit 307 includes a light source, and can further include an optical system including a lens and a mirror that guide light from the light source. A substrate stage 303 supports a substrate chuck 302 (substrate holding unit) for holding the substrate 110 carried in by the conveyance mechanism 104. A planarization head 313 supports a member chuck 312 for holding the planarization member 109. A drive unit 309 drives the planarization head 313 in a vertical direction (Z-direction), and a guide 308 guides movement of the planarization head 313 in the vertical direction. The drive unit 309 then brings a surface 109a of the planarization member 109 into contact with droplets of the curable composition 201 supplied onto the substrate 110 to planarize the curable composition 201. The irradiation unit 307 (first curing unit) irradiates the curable composition 201 with light in this state to cure the curable composition 201. After the curing, the drive unit 309 moves the planarization member 109 upward, and separates the planarization member 109 from the curable composition 201 on the substrate 110 (separation). With this processing, a cured product having a surface shape corresponding to a shape of a contact surface of the planarization member 109 is formed on the substrate 110.

The substrate stage 303 is capable of moving the substrate 110 over a base 304 in a state where the substrate 110 is held by the substrate chuck 302. When the substrate 110 is carried onto the substrate chuck 302 or carried out from the substrate chuck 302, the substrate stage 303 is moved to a position distanced from a position below the planarization head 313. This facilitates avoidance of interference (physical contact) between the conveyance mechanism 104 and the planarization head 313. The substrate stage 303 is moved by a minutely small amount before the curable composition 201 on the substrate 110 and the planarization member 109 are brought into contact with each other, whereby the relative positions of the planarization member 109 and the substrate 110 can be finely adjusted. As a drive unit 305 that drives the substrate stage 303, a linear motor is used in the present exemplary embodiment. However, the drive unit 305 is not limited thereto, and a known technique such as a drive mechanism in which a ball screw and a rotary motor are combined can be applied. In the present exemplary embodiment, moving directions of the substrate stage 303 are two axial direction directions of X- and Y-directions, but the moving directions are not limited thereto and may be six axial directions. The substrate stage 303 may include a top panel and a plate-like member coupled to the top panel.

In addition, a separation assist mechanism 316 is arranged on the substrate stage 303 to assist separation. The separation assist mechanism 316 is driven upward in the Z-direction so as to pass a notch that is used for positioning of the substrate 110 in a circumferential direction, comes in contact with the planarization member 109, pushes the planarization member 109 upward, and thereby assists the separation.

The substrate chuck 302 is adsorbed by the substrate stage 303 and is thereby fixed to the substrate stage 303. The substrate chuck 302 includes a holding surface that holds the substrate 110. As a holding method used by the substrate chuck 302 to hold the substrate 110, a known method such as a vacuum adsorption method and an electrostatic adsorption method can be applied. In the case of the vacuum adsorption method, a recessed portion (groove) formed on the surface of the substrate chuck 302 and a negative pressure generation apparatus are communicated with each other. The substrate chuck 302 is capable of holding the substrate 110 by the inside of the recessed portion being put under negative pressure in a state where the substrate 110 is placed on the holding surface of the substrate chuck 302. The member chuck 312 includes a holding surface that holds the planarization member 109, and holds the planarization member 109 by use of a known technique such as the vacuum adsorption method and the electrostatic adsorption method.

A plurality of struts 301 is arranged on the base 304, and a structure 306 is supported by the struts 301. The structure 306 may be a top panel. Four struts 301 are arranged in the present exemplary embodiment (only two struts 301 are illustrated in FIG. 3), but the number of struts 301 is not limited thereto. A stage 314 is supported by (suspended from) the structure 306 via the struts 301. A through the mold (TTM) scope 315 is mounted to the stage 314. Further, a sensor (not illustrated) for measuring the height of a surface of the substrate 110 may be mounted to the stage 314. An opening through which the guide 308 penetrates is arranged in each of the structure 306 and the stage 314.

An off-axis scope 311 is capable of detecting a reference mark arranged on the substrate stage 303, and the mark formed on the substrate 110 mounted on the substrate stage 303. The TTM scope 315 is capable of detecting the reference mark arranged on the substrate stage 303, and a mark formed on the planarization member 109 held by the member chuck 312. In the present exemplary embodiment, relative positions of the reference mark on the substrate stage 303 and the mark formed on the planarization member 109 are measured by use of the TTM scope 315, and relative positions of the reference mark on the substrate stage 303 and the substrate 110 are measured by use of the off-axis scope 311. The position of the planarization member 109 or the substrate 110 is adjusted by use of the measured relative positions, whereby the planarization member 109 and the substrate 110 can be brought into contact with each other at desired relative positions. These scopes can each include a light source, an image pickup element, and an optical system that guides light for detection to a target or the image pickup element.

Figure 4:
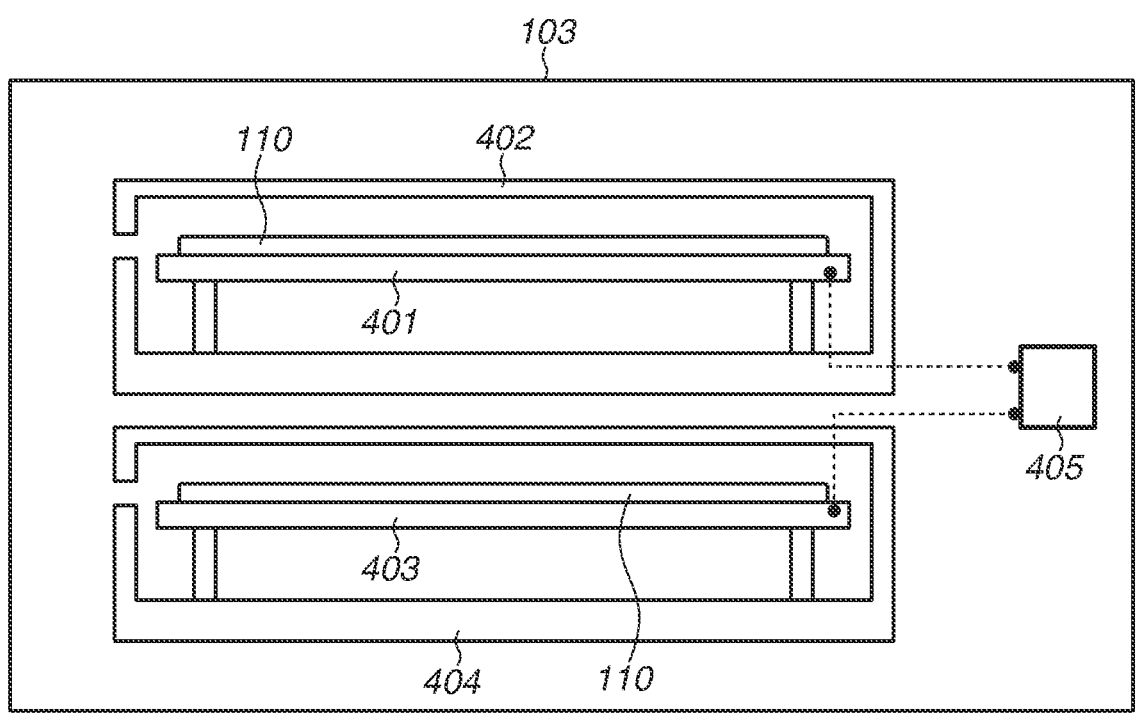
FIG. 4 is a diagram illustrating a configuration of a heat processing module of the planarization apparatus.

FIG. 4 is a configuration diagram illustrating the heat processing module 103 (second curing unit) of the planarization apparatus 100. The heat processing module 103 is a module that performs post-exposure baking processing that heats the curable composition 201 that has been cured by the planarization module 102 to advance curing.

The heat processing module 103 includes a heating chuck 401 that holds and heats the substrate 110, a heating chamber 402 arranged around the heating chuck 401, the cooling chuck 403 that holds and cools the substrate 110, and a cooling chamber 404 arranged around the cooling chuck 403.

The heating chuck 401 holds the substrate 110 carried in by the conveyance mechanism 104, and heats the substrate 110. The heating chuck 401 needs to have high thermal conductivity in terms of speed-up of temperature increase and decrease. For example, a thermal conductivity of 150 W/mK or more is preferable. The heating chuck 401 includes a power source 405. Power supplied from the power source 405 heats a heating element and can thereby heat the heating chuck 401. A heating method may be a method of irradiating the substrate 110 with infrared rays instead of heating by the heating chuck 401.

The heating chamber 402 is arranged so as to surround the heating chuck 401. It is preferable that the heating chamber 402 be capable of forming a closed space at the time of heating by the heating chuck 401. It is also preferable that an atmosphere inside the heating chamber 402 be maintained also when the substrate 110 is carried in or out of the heating chuck 401, and that an opening for carry-in/carry-out of the substrate 110 in the heating chamber 402 be as small as possible and opening/closing of the heating chamber 402 be performed in a short period of time.

The cooling chuck 403 holds the substrate 110 and cools the substrate 110. The cooling chuck 403 is controlled to be at a temperature lower than that of the heating chuck 401, and cools the substrate 110 heated by the heating chuck 401 to a temperature that permits carry-out before the substrate 110 is carried out to the substrate carrier 108. The cooling chamber 404 is arranged so as to surround the cooling chuck 403.

Figure 7:
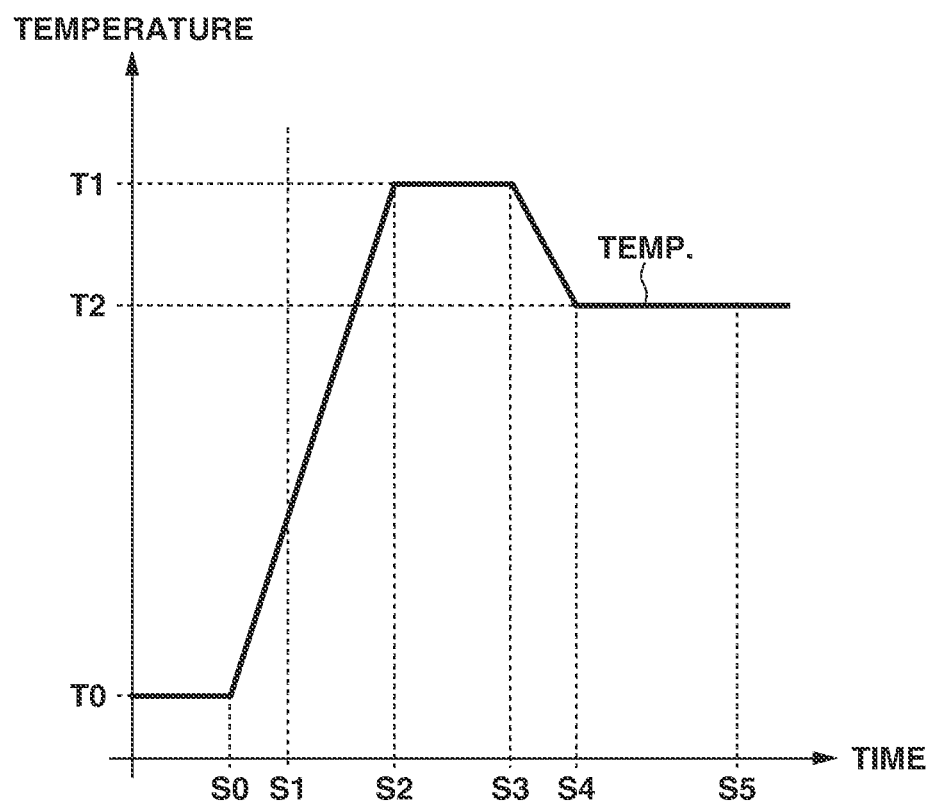
FIG. 7 is a graph illustrating heat processing in the heat processing module.

FIG. 7 illustrates a heating step of the heating chuck 401 until the heat processing module 103 carries the substrate 110 into the heating chuck 401. The heat processing module 103 starts heating of the heating chuck 401 at time S0, and increases a temperature from an initial temperature T0 to a first temperature T1 until time S2. The first temperature T1 is higher than a second temperature T2, which is a heating temperature at which the substrate 110 is heated. In addition, the first temperature T1 is desirably 250° C. or more to burn off impurities including water on the heating chuck 401. The heat processing module 103 keeps heating the heating chuck 401 at the first temperature T1 from the time S2 to time S3. The processing so far is a first step. When the first step is completed, the heat processing module 103 decreases a temperature of the heating chuck 401 until the second temperature T2. The processing so far is a second step. When the second step is completed, the planarization apparatus 100 starts carry-in of the substrate 110 from time S5, places the substrate 110 onto the heating chuck 401, and heats the substrate 110 for a predetermined period of time.

Figure 5A:
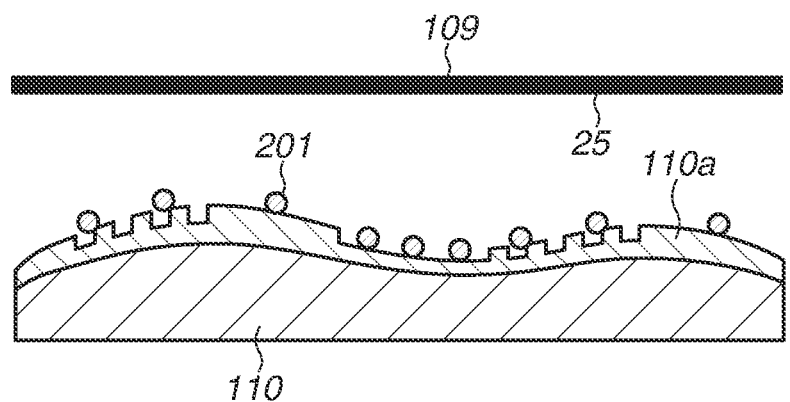
FIGS. 5A to 5C are diagrams for describing planarization processing.
Figure 5B:
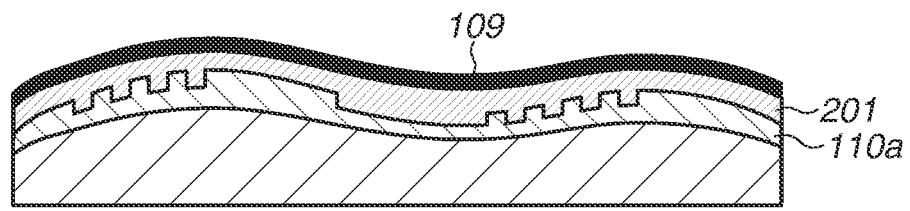
Figure 5C:
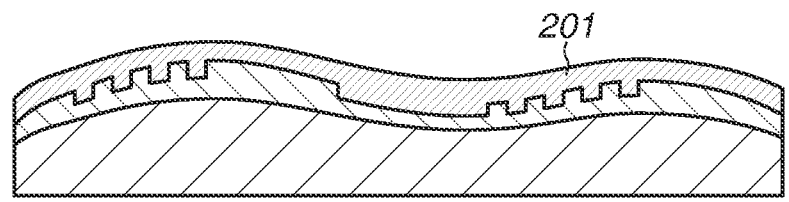

Subsequently, the planarization processing performed mainly by the application module 101 and the planarization module 102 of the planarization apparatus 100 is described with reference to FIGS. 5A to 5C. First, the curable composition 201 is supplied by the dispenser 206 to the substrate 110 on which a base pattern 110a is formed. FIG. 5A illustrates a state after the curable composition 201 is placed on the substrate 110 and before the planarization member 109 is brought into contact with the curable composition 201. Subsequently, as illustrated in FIG. 5B, the curable composition 201 on the substrate 110 and a flat surface 25 of the planarization member 109 are brought into contact with each other. The planarization member 109 presses the curable composition 201, whereby the curable composition 201 spreads over the entire surface of the substrate 110. FIG. 5B illustrates a state where the entire flat surface 25 of the planarization member 109 comes in contact with the curable composition 201 on the substrate 110, and the flat surface 25 of the planarization member 109 follows a surface shape of the substrate 110. In the state illustrated in FIG. 5B, the curable composition 201 on the substrate 110 is irradiated with light from a light source 20 via the planarization member 109, whereby the curable composition 201 is cured. Then, the planarization member 109 is separated from the cured curable composition 201 on the substrate 110. With this processing, a cured layer (planarized layer) of the curable composition 201 having a uniform thickness over the entire surface of the substrate 110 is formed. FIG. 5C illustrates a state where the planarized layer of the curable composition 201 is formed on the substrate 110.

Figure 6:
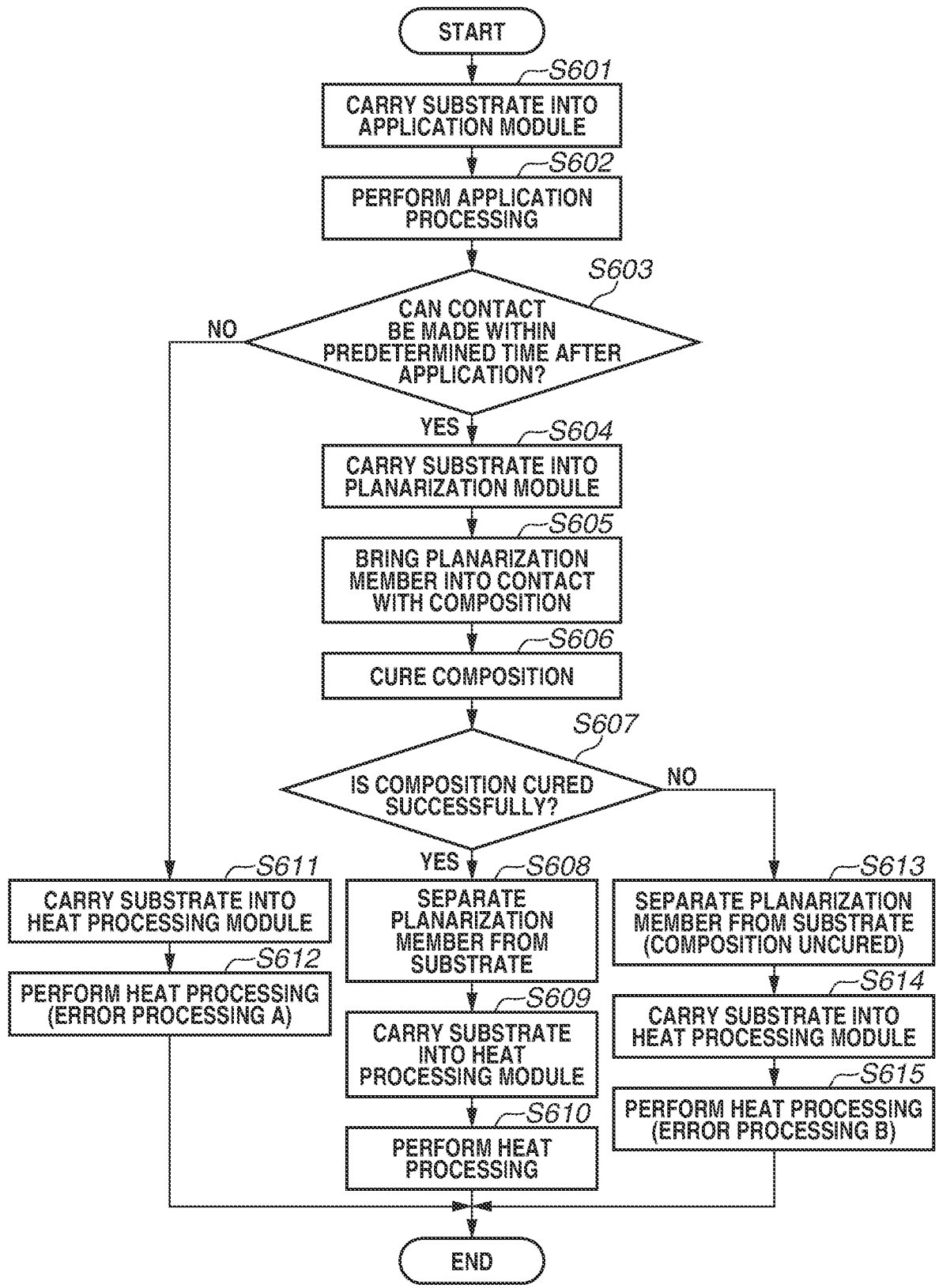
FIG. 6 is a flowchart illustrating a flow of the planarization processing in the planarization apparatus.

Subsequently, a description will be provided of, in the planarization processing according to the present exemplary embodiment, processing when normal processing is performed and processing when it is determined that the normal processing cannot be continued, with reference to a flowchart in FIG. 6. The processing mentioned herein is performed by the control unit 111 performing overall control of each unit of the planarization apparatus 100.

In step S601, the control unit 111 controls the conveyance mechanism 104 to carry out the substrate 110 from the substrate carrier 108 and carry the substrate 110 into the application module 101. In step S602, the control unit 111 controls the application module 101 to apply the curable composition 201 to the substrate 110.

In step S603, the control unit 111 causes the conveyance mechanism 104 to carry out the substrate 110 from the application module 101. At a timing when the substrate 110 can be carried into the planarization module 102, the control unit 111 determines whether the curable composition 201 can be brought into contact with the planarization member 109 within a predetermined time after the curable composition 201 is applied to the substrate 110 in the application module 101. In a case where the curable composition 201 can be brought into contact with the planarization member 109 within the predetermined time (YES in step S603), the control unit 111 determines that the normal processing can be performed, and thus the processing proceeds to step S604. In step S604, the control unit 111 causes the conveyance mechanism 104 to carry the substrate 110 into the planarization module 102. In contrast, in a case where the curable composition 201 cannot be brought into contact with the planarization member 109 within the predetermined time (NO in step S603), the control unit 111 determines that the normal processing cannot be performed, and the processing proceeds to step S611. Examples of a factor that prevents the curable composition 201 from coming into contact with the planarization member 109 within the predetermined time include a case where the processing of a previous substrate 110 is delayed or the like in the planarization module 102 and mounting of the substrate 110 to the planarization module 102 is kept on standby.

In step S605, the control unit 111 brings the surface 109a of the planarization member 109 into contact with the curable composition 201 on the substrate 110 in the planarization module 102. Even after the substrate 110 is carried into the planarization module 102, in a case where a timing when the surface 109a of the planarization member 109 is brought into contact with the curable composition 201 on the substrate 110 is delayed, the curable composition 201 cannot be brought into contact with the planarization member 109 within the predetermined time, and consequently, the normal processing cannot be performed. In such a case, the control unit 111 causes the conveyance mechanism 104 to carry out the substrate 110 from the planarization module 102, and the processing proceeds to step S611. Examples of a factor that prevents the curable composition 201 from coming into contact with the planarization member 109 within the predetermined time even after the substrate 110 is carried into the planarization module 102 include a case where measurement processing performed in the planarization module 102 before the planarization processing is started takes time.

In step S606, the control unit 111 causes the irradiation unit 307 to irradiate the curable composition 201 with light to cure the curable composition 201 (first curing). In light irradiation by the irradiation unit 307, the control unit 111 cures the curable composition 201 to such a degree as to avoid collapse of the formed curable composition 201 at the time of separation. An irradiation light amount [J/m²] and exposure time [seconds] that are irradiation conditions for performing first curing with light by the irradiation unit 307 can be set from the input unit 112.

In step S607, the control unit 111 determines whether irradiation is performed without a trouble of the irradiation unit 307. In a case where the control unit 111 determines that irradiation is performed without a problem (YES in step S607), the processing proceeds to step S608. In step S608, the control unit 111 separates the planarization member 109 from the substrate 110 (separation). In a case where the irradiation is not performed due to a trouble (NO in step S607), the processing proceeds to step S613. In step S613, the control unit 111 separates the planarization member 109 from the substrate 110. Since the curable composition 201 on the substrate 110 is in the uncured state at the time of separation, the planarization member 109 needs to be cleaned after the separation.

In step S609, the control unit 111 controls the conveyance mechanism 104 to carry the substrate 110 into the heating chuck 401 of the heat processing module 103. In step S610, the control unit 111 heats the curable composition 201 that has been planarized and subjected to the first curing in the heat processing module 103, and performs second curing. A processing temperature [° C.] and heat processing time [seconds] that are heating conditions for performing the second curing in the heat processing module 103 can be set from the input unit 112. After the second curing, the control unit 111 causes the conveyance mechanism 104 to carry out the substrate 110 from the heating chuck 401 and carry the substrate 110 into the cooling chuck 403. After cooling of the substrate 110, the control unit 111 causes the conveyance mechanism 104 to carry out the substrate 110 from the cooling chuck 403 and carry the substrate 110 into the substrate carrier 108, and ends the processing.

In contrast, in a case where it is determined that the curable composition 201 cannot be brought into contact with the planarization member 109 within the predetermined time (NO in step S603), the control unit 111 determines that the normal processing cannot be performed, and the processing proceeds to step S611. In step S611, the control unit 111 controls the conveyance mechanism 104 to carry the substrate 110 into the heating chuck 401 of the heat processing module 103. In step S612, the control unit 111 performs control to heat the curable composition 201 that is on the substrate 110 and that is not subjected to the first curing by the irradiation unit 307 to be cured in the heat processing module 103 (error processing A). Thereafter, the control unit 111 causes the conveyance mechanism 104 to carry out the substrate 110 from the heating chuck 401, and carry the substrate 110 into the cooling chuck 403. After cooling of the substrate 110, the control unit 111 causes the conveyance mechanism 104 to carry out the substrate 110 from the cooling chuck 403 and carry the substrate 110 into the substrate carrier 108, and ends the processing.

In the case where the first curing is not performed as just described, the curable composition 201 on the substrate 110 is cured by the heat processing module 103 and thereafter returned to the substrate carrier 108. This prevents carry-out of the substrate 110 to which the curable composition 201 in the uncured state is applied and contamination of the inside and outside of the planarization apparatus 100.

When the control unit 111 determines that the irradiation is not performed due to a trouble in step S607, the processing proceeds to step S613. In step S613, the planarization member 109 is separated from the substrate 110. Thereafter, the processing proceeds to step S614. In step S614, the control unit 111 performs control to heat the curable composition 201 that is on the substrate 110 and that is not subjected to the first curing by the irradiation unit 307 to be cured in the heat processing module 103 (error processing B). Thereafter, the control unit 111 causes the conveyance mechanism 104 to carry out the substrate 110 from the heating chuck 401, and carry the substrate 110 into the cooling chuck 403. After cooling of the substrate 110, the control unit 111 causes the conveyance mechanism 104 to carry out the substrate 110 from the cooling chuck 403 and carry the substrate 110 into the substrate carrier 108, and ends the processing.

In the case where the first curing is not performed as just described, the curable composition 201 on the substrate 110 is cured by the heat processing module 103 and thereafter returned to the substrate carrier 108. This prevents carry-out of the substrate 110 to which the curable composition 201 in the uncured state is applied and contamination of the inside and outside of the planarization apparatus 100.

The temperature [° C.] and the heating time [seconds] that are the heating conditions for curing the uncured curable composition 201 in the heat processing module 103 in the error processing A and the error processing B can be set differently from the heating conditions for the second curing that is used at the time of the normal processing, and can be set from the input unit 112. Specifically, the heating time at the time of the error processing is desirably set to be shorter than the heating time at the time of the second curing that is used at the time of the normal processing.

Figure 8:
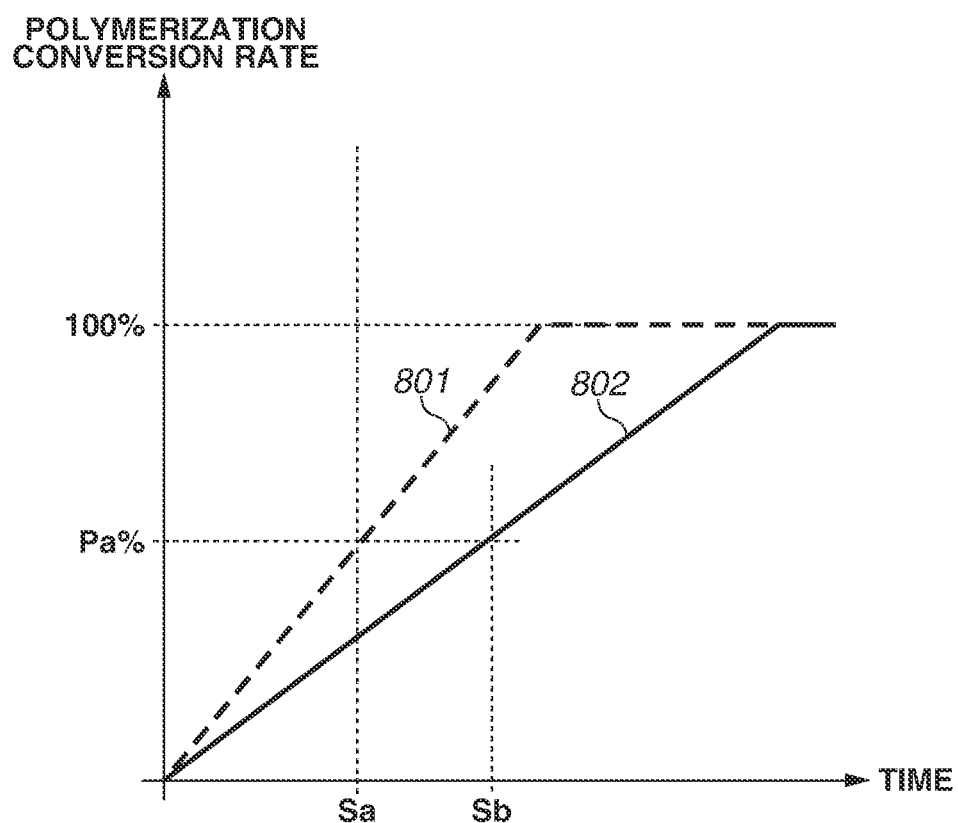
FIG. 8 is a graph illustrating a polymerization conversion rate of a curable composition.

The heating conditions for curing performed in the heat processing module 103 in the error processing A and the error processing B can also be obtained from the irradiation conditions for the first curing performed by light irradiation by the irradiation unit 307 at the time of the normal processing. FIG. 8 illustrates a polymerization conversion rate of the curable composition 201. A conversion rate 801 by light irradiation indicates to what degree curing of the curable composition 201 advances when the curable composition 201 is irradiated with light in a light amount I [J/m$^2$] for exposure time S [seconds]. A gradient of the conversion rate 801 by light irradiation can be expressed as a constant F1(I) dependent on the light amount I [J/m$^2$] of irradiated light. A conversion rate 802 by heating indicates to what degree curing of the curable composition 201 advances when the curable composition 201 is heated at a temperature T [° C.] for heat time S [seconds]. A gradient of the conversion rate 802 by heating can be expressed as a constant F2(T) dependent on the temperature T [° C.] at which heating is performed.

For this reason, based on a light amount Ia [J/m$^2$] and exposure time Sa [seconds], which are irradiation conditions for the first curing in the planarization module 102, heating conditions for curing of the curable composition 201 in the error processing A and the error processing B can be obtained from the irradiation conditions of the first curing as follows.

A polymerization conversion rate Pa=F1(Ia)×Sa [%] in the case of the light amount Ia [J/m$^2$] and the exposure time Sa [seconds]. To make the curable composition 201 in an equivalent cured state when subjected to heat processing in the error processing A or B, an equivalent polymerization conversion rate needs to be obtained, so that necessary heating time at a temperature Tb [° C.] is as follows.

$$\text{Heating time } Sb = F1(Ia) \times Sa / F2(Tb) \quad (1)$$

By performing heat processing on the curable composition 201 in the error processing A or B using such heating conditions in the heat processing module 103, the curable composition 201 can be cured to a degree equivalent to that when the curable composition 201 is irradiated with light by the irradiation unit 307, whereby heat processing conditions can be determined in a simple manner. The irradiation conditions for the first curing are used because, if the curable composition 201 is cured to hardness obtained in the first curing, there is a low possibility that the inside and outside of the planarization apparatus 100 is contaminated even when the curable composition 201 is returned to the substrate carrier 108. By taking only the first curing into consideration, it is possible to prevent too much time from being taken for the heat processing.

While the description has been provided, in the present exemplary embodiment, of the example of performing the first curing by light irradiation and performing the second curing by heating, both the first curing and the second curing can be performed by light irradiation. In such a case, the exposure time [seconds] may be set differently from the irradiation condition of curing of the curable composition 201 from the input unit 112 while the light amount [J/m$^2$] as the irradiation condition for curing of the curable composition 201 is used. Alternatively, the irradiation conditions of the second curing may be determined from the irradiation conditions of the first curing. Not only the photocuring method, but also the thermosetting method can be employed for the first curing.

While the description is provided of the planarization apparatus in the present exemplary embodiment, the present disclosure can also be applied to an imprint apparatus that imprints a pattern on a substrate by use of a mold in which a pattern is formed.

Exemplary Embodiment of Article Manufacturing Method

Subsequently, a description is provided of a manufacturing method for an article (a semiconductor integrated circuit (IC) element, a liquid crystal display element, a color filter, a micro-electromechanical systems (MEMS), or the like) by use of the above-mentioned planarization apparatus. The manufacturing method uses the above-mentioned planarization apparatus and includes a step of bringing a composition arranged on a substrate (a wafer, a glass substrate, or the like) and a plate into contact with each other to planarize the composition, a step of curing the composition, and a step of separating the composition and the plate from each other. With this processing, a planarized layer is formed on the substrate. Then, such processing as to form a pattern on the substrate on which the planarized layer has been formed by use of a lithography apparatus is performed, and the processed substrate is subjected to another known process step, whereby the article is manufactured. The other process step includes etching, resist separation, dicing, bonding, and packaging.

According to the present manufacturing method, an article having quality higher than that of a conventional article can be manufactured.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-087574, filed May 30, 2022, which is hereby incorporated by reference herein in its entirety.

What is claimed is:

1. A forming apparatus configured to cure a curable composition on a substrate in a state where a member is in contact with the curable composition to form a layer on the substrate, the forming apparatus comprising:
   an application unit configured to apply the curable composition to the substrate;
   a first curing unit configured to cure the curable composition on the substrate;
   a second curing unit configured to cure the curable composition on the substrate by heating; and
   a control unit configured to perform forming processing of forming the layer by controlling the first curing unit to cure the curable composition in a state where the member is in contact with the curable composition, and then controlling the second curing unit to further cure the curable composition separated from the member,
   wherein the control unit is configured to, when determining not to perform curing of the curable composition by the first curing unit, control the second curing unit to cure the curable composition in a state where the member is separated, and
   wherein the control unit is configured to perform control to make, as a heating condition of the second curing unit in a second case where curing is performed not by the first curing unit but by the second curing unit, a processing time shorter than a processing time as a heating condition of the second curing unit in a first case where curing is performed by the first curing unit and then curing is further performed by the second curing unit.

2. The forming apparatus according to claim 1, wherein the control unit is configured to, in a case that the member is not brought into contact with the curable composition within a predetermined time after the curable composition is applied to the substrate by the application unit, determine not to perform curing by the first curing unit.

3. The forming apparatus according to claim 2, wherein the control unit is configured to determine whether the forming processing can be performed before the member is brought into contact with the curable composition on the substrate to determine not to perform curing of the curable composition on the substrate by the first curing unit.

4. The forming apparatus according to claim 3, wherein the control unit is configured to, in a case of determining unsuccessful curing of the curable composition by the first curing unit even though the member is brought into contact with the curable composition after the curable composition is applied to the substrate by the application unit, perform control to perform curing by the second curing unit after the member is separated.

5. The forming apparatus according to claim 1, wherein the heating condition of the second curing unit in the second case is determined depending on a processing condition of the first curing unit in the first case.

6. The forming apparatus according to claim 1, wherein the first curing unit is configured to cure the curable composition by light irradiation.

7. The forming apparatus according to claim 1, wherein the control unit is configured to, in a case that the curable composition fails to be cured by the first curing unit even though the member is brought into contact with the curable composition after the curable composition is applied to the substrate by the application unit, perform control to perform curing by the second curing unit after the member is separated without performing curing by the first curing unit.

8. A forming method of curing a curable composition on a substrate in a state where a member is in contact with the curable composition to form a layer on the substrate, the method comprising:
applying the curable composition to the substrate;
determining whether to cause a first curing unit to cure the curable composition on the substrate to which the curable composition is applied;
curing, in a first case that it is determined that curing of the curable composition is to be performed, the curable composition in a state where the member is in contact with the curable composition, separating the member, and further curing the curable composition by heating using a second curing unit; and
performing, in a second case that it is determined that curing of the curable composition is not to be performed, curing by the second curing unit in a state where the curable composition is separated from the member without performing curing by the first curing unit, and
performing control to make, as a heating condition of the second curing unit in the second case where curing is performed not by the first curing unit but by the second curing unit, a processing time shorter than a processing time as a heating condition of the second curing unit in the first case where curing is performed by the first curing unit and then curing is further performed by the second curing unit.

9. An article manufacturing method comprising:
performing processing on a substrate by use of a forming apparatus configured to cure a curable composition on the substrate in a state where a member is in contact with the curable composition to form a layer on the substrate, the forming apparatus comprising:
an application unit configured to apply the curable composition to the substrate;
a first curing unit configured to cure the curable composition on the substrate;
a second curing unit configured to cure the curable composition on the substrate by heating; and
a control unit configured to perform forming processing of forming the layer by controlling the first curing unit to cure the curable composition in a state where the member is in contact with the curable composition, and then controlling the second curing unit to further cure the curable composition separated from the member,
wherein the control unit is configured to, when determining not to perform curing of the curable composition by the first curing unit, control the second curing unit to cure the curable composition in a state where the member is separated, and
wherein the control unit is configured to perform control to make, as a heating condition of the second curing unit in a second case where curing is performed not by the first curing unit but by the second curing unit, a processing time shorter than a processing time as a heating condition of the second curing unit in a first case where curing is performed by the first curing unit and then curing is further performed by the second curing unit; and
manufacturing an article by performing a process on the substrate subjected to the processing.

* * * * *